(12) United States Patent  
Ryu et al.

(10) Patent No.: US 11,181,571 B2
(45) Date of Patent: Nov. 23, 2021

(54) ELECTRONIC DEVICE FOR MANAGING DEGREE OF DEGRADATION

(71) Applicant: Samsung Electronics Co., Ltd., Suwon-si (KR)

(72) Inventors: Dong-Uk Ryu, Seongnam-si (KR); Seongbeom Kim, Suwon-si (KR); Janghyuk An, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 16/414,077

(22) Filed: May 16, 2019

(65) Prior Publication Data

US 2020/0132749 A1 Apr. 30, 2020

(30) Foreign Application Priority Data

Oct. 29, 2018 (KR) ........................ 10-2018-0130071

(51) Int. Cl.
*G01R 31/26* (2020.01)
*G01R 31/27* (2006.01)
(Continued)

(52) U.S. Cl.
CPC ........ *G01R 31/2642* (2013.01); *B60R 16/023* (2013.01); *G01R 19/16576* (2013.01); *G01R 31/27* (2013.01)

(58) Field of Classification Search
CPC .......... G01R 31/2642; G01R 19/16576; G01R 31/27; G01R 31/2855; G01R 31/2894;
(Continued)

(56) References Cited

U.S. PATENT DOCUMENTS 8,266,572 B2 9/2012 Kim et al.
9,407,272 B2 8/2016 Penzes et al.
(Continued)

FOREIGN PATENT DOCUMENTS

KR 10-2018-0091546 A 8/2018

OTHER PUBLICATIONS

Igarashi, et al. "R-CAR GEN3: Computing Platform for Autonomous Driving Era," Automotive Solution Biz. Unit, Renesas Electronics Corporation, pp. 1-29 (2017).
Mitsuhiko Igarashi et al., "NBTI/PBTI separated BTI monitor with 4.2x Sensitivity", IEEE Asian Solid-State Circuits Conference.

*Primary Examiner* — Lee E Rodak
(74) *Attorney, Agent, or Firm* — Harness, Dickey & Pierce, P.L.C.

(57) ABSTRACT

An electronic device including a processor and a sensor may be provided. The processor obtains a first degree of degradation of a first core based on a first parameter value associated with a lifetime of the first core and a first operating level associated with an operation of the first core. The processor obtains a second degree of degradation of a second core based on a second parameter value associated with a lifetime of the second core and a second operating level associated with an operation of the second core. The processor schedules a task of the first core and the second core based on the first degree of degradation and the second degree of degradation. The sensor provides the first parameter value and the first operating level to the first core and the second parameter value and the second operating level to the second core.

9 Claims, 14 Drawing Sheets

(51) Int. Cl.
*G01R 19/165* (2006.01)
*B60R 16/023* (2006.01)

(58) Field of Classification Search
CPC ... B60R 16/023; G11C 16/349; G06F 1/3206;
G06F 1/3296; G06F 11/3024; G06F 1/26;
G06F 1/324; G06F 11/3062; G06F
11/3409; G06F 1/206; G06F 1/3243;
G06F 11/008; G06F 11/3058; G06F
11/3093; G06F 11/3433; G06F 11/3466;
G06F 11/348; G06F 12/14; G06F
15/7821; G06F 1/32; G06F 1/3203; G06F
1/3209; G06F 1/3228; G06F 1/3234;
G06F 1/3287; G06F 21/44; G06F
2201/81; G06F 2201/815; G06F 2201/86;
G06F 2201/865; G06F 2201/88; G06F
2201/885; G06F 3/0625; G06F 3/065;
G06F 3/0679; G06F 9/45533; G06F
9/4881; G06F 9/505; G06F 9/5066; G06F
9/5077; G06F 9/5094; G06F 9/52
See application file for complete search history.

(56) References Cited

U.S. PATENT DOCUMENTS

| | | | |
|---|---|---|---|
| 9,483,068 B2 | 11/2016 | Raja et al. | |
| 9,488,998 B2* | 11/2016 | Meijer | G06F 1/3243 |
| 9,606,843 B2* | 3/2017 | Anderson | G06F 9/5094 |
| 9,817,743 B2 | 11/2017 | Ishihara | |
| 9,904,339 B2 | 2/2018 | Shapira et al. | |
| 10,120,430 B2* | 11/2018 | Kosonocky | G01R 31/2856 |
| 2013/0047166 A1* | 2/2013 | Penzes | G06F 12/14 |
| | | | 718/105 |
| 2014/0244212 A1* | 8/2014 | Allen-Ware | G01R 31/2851 |
| | | | 702/182 |
| 2016/0061667 A1* | 3/2016 | Hwang | G01K 7/00 |
| | | | 374/183 |
| 2017/0147369 A1 | 5/2017 | Spracklen | |
| 2017/0153958 A1* | 6/2017 | Parikh | G06F 11/24 |
| 2017/0364140 A1* | 12/2017 | Banerjee | G06F 1/3228 |
| 2018/0143853 A1 | 5/2018 | Saeidi et al. | |
| 2018/0225053 A1 | 8/2018 | Yim et al. | |
| 2019/0204893 A1* | 7/2019 | Rotem | G06F 1/3287 |

* cited by examiner

ELECTRONIC DEVICE FOR MANAGING DEGREE OF DEGRADATION

CROSS-REFERENCE TO RELATED APPLICATIONS

This application claims priority under 35 U.S.C. § 119 to Korean Patent Application No. 10-2018-0130071 filed on Oct. 29, 2018, in the Korean Intellectual Property Office, the disclosure of which is incorporated by reference herein in its entireties.

BACKGROUND

Example embodiments of the inventive concepts described herein relate to electronic devices, and more particularly, relate to electronic devices configured to manage a degree of degradation.

An electronic device is being included within various things as information communication technologies develop. For example, various vehicles used as a means of transportation include electronic devices for various purposes. For example, a vehicle includes electronic devices for controlling machines constituting the vehicle for passenger safety, autonomous driving, and/or prevention of environment pollution.

Electronic devices may be implemented with various semiconductor chips. A lifetime of a semiconductor chip is limited because the semiconductor chip degrades due to the use. For example, the semiconductor chip may include semiconductor elements including an insulating layer such as an oxide layer. In the case where a voltage is continuously applied to the insulating layer for an operation of the semiconductor chip, the insulating layer may be gradually damaged. As such, the performance and lifetime of the semiconductor chip may be reduced.

Because a warranty period of a vehicle tends to be longer than that of an electronic device such as a mobile device, the electronic device used in the vehicle is desired to have a lifetime corresponding to the long warranty period. Accordingly, a technology for increasing the lifetime of the semiconductor chip is desired.

SUMMARY

Some example embodiments of the inventive concepts provide electronic devices configured to calculate a degree of degradation to manage the degree of degradation of a semiconductor chip, and/or to perform various operations based on the degree of degradation thus calculated.

According to an example embodiment, an electronic device may include a processor and a sensor. The processor may be configured to obtain a first degree of degradation of a first core based on a first parameter value and a first operating level, the first parameter value being associated with a first lifetime of the first core, the first operating level being associated with a first operation of the first core, obtain a second degree of degradation of a second core based on a second parameter value and a second operating level, the second parameter value being associated with a second lifetime of the second core, the second operating level being associated with a second operation of the second core, and schedule a task with respect to the first core and the second core based on the first degree of degradation and the second degree of degradation. The sensor may be configured to provide the first parameter value and the first operating level to the first core, and the second parameter value and the second operating level to the second core. The first operating level may be a first minimum level of a first operating voltage for operating the first core with a first reference performance, and the second operating level may be a second minimum level of a second operating voltage for operating the second core with a second reference performance.

According to an example embodiment, an electronic device may include a processor, a voltage generator, and a sensor. The processor may be configured to determine an operating level and a target core based on a parameter value associated with a lifetime, the operating level being associated with a reference performance, the target core being one selected among a plurality of cores included in the processor and to which a task is to be assigned. The voltage generator may be configured to supply an operating voltage to the processor. The sensor may be configured to obtain the parameter value, measure the operating level of the operating voltage supplied to the processor, and provide the operating level to the processor. The operating level may be a minimum level of the operating voltage for operating the processor with the reference performance.

According to an example embodiment, an electronic device may include a control circuit and a sensor. The control circuit may be configured to obtain a degree of degradation of a semiconductor chip based on a parameter value and an operating level, the parameter value being associated with a lifetime of the semiconductor chip, the operating level being associated with a reference performance of the semiconductor chip, control the semiconductor chip to perform a first operation, and starts a second operation of the semiconductor chip, which has been controlled to perform the first operation, based on the obtained degree of degradation. The sensor may be configured to provide the parameter value and the operating level to the semiconductor chip. The operating level may be a minimum level of an operating voltage for operating the semiconductor chip with the reference performance.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, some example embodiments of the inventive concepts may be described in detail and clearly to such an extent that an ordinary one in the art easily implements the inventive concepts.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. In other words, expressions such as "at least one of," when preceding a list of elements, modify the entire list of elements and do not modify the individual elements of the list.)

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Figure 1:
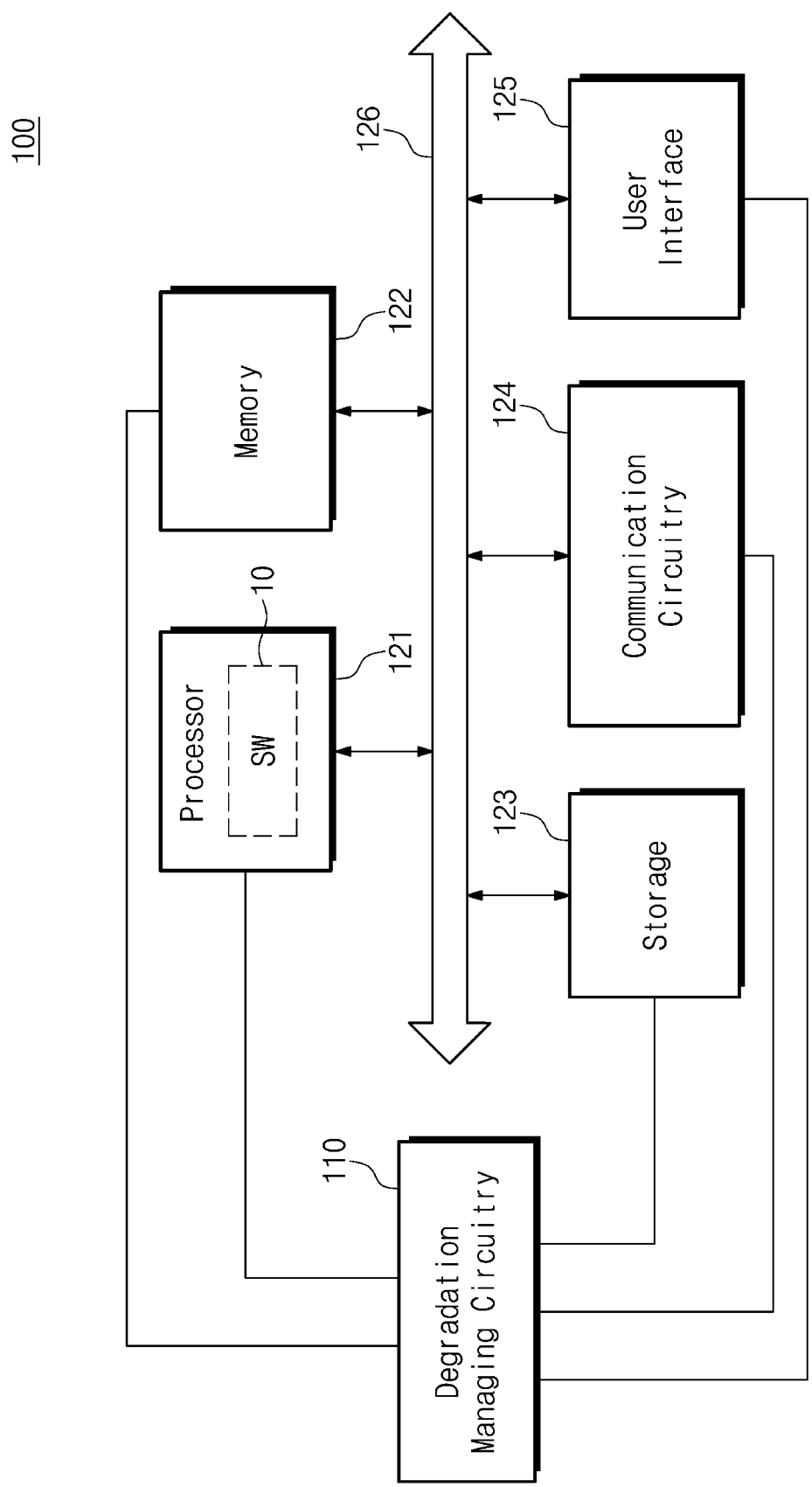
FIG. 1 is a block diagram illustrating an electronic device according to an example embodiment of the inventive concepts.

FIG. 1 is a block diagram illustrating an electronic device according to an example embodiment of the inventive concepts.

Referring to FIG. 1, an electronic device 100 may include a degradation managing block or degradation managing circuitry 110, a processor 121, a memory 122, storage 123, a communication device or a communication circuitry 124, a user interface 125, and a bus 126. For example, the electronic device 100 may be one of a personal computer (PC), a workstation, a notebook computer, a mobile device, an electric vehicle, etc. The electronic device 100 may further include at least one component not illustrated in FIG. 1. In some example embodiments, the electronic device 100 may not include one or more of the components illustrated in FIG. 1.

For example, each component may be implemented with a semiconductor chip. As a semiconductor chip operates, a performance of semiconductor elements constituting the semiconductor chip may be reduced. For example, as semiconductor elements are used for an operation of the electronic device 100, bias temperature instability (BTI), time dependent dielectric breakdown (TDDB), and/or hot-carrier injection (HCI) may occur, and thus, the performance and lifetime of the semiconductor chip may be reduced. For example, in the semiconductor chip, a level of a threshold voltage of a transistor may increase due to a breakdown of an oxide layer of the transistor, and a minimum level of a voltage for operating the semiconductor chip (hereinafter referred to as a "minimum operating level LVcc") may increase.

In the present disclosure, that a semiconductor chip "operates normally" means that the semiconductor chip operates with a performance satisfying user requirements and the intention of the designer (hereinafter referred to as a "reference performance"). For example, the reference performance may be determined in consideration of a lifetime and an operating speed of a semiconductor chip. In the present disclosure, that a semiconductor chip "does not operates normally" means that the semiconductor chip operates with a performance lower than the reference performance or does not operate.

Accordingly, semiconductor chips may operate with the reference performance based on an operating voltage having a level that is not less than the minimum operating level. For example, that a core operates normally may mean that the core operates at an operating speed that is not lower than an operating speed intended by the designer. In the present disclosure, a "lifetime" of a semiconductor chip means a time length during which the semiconductor chip is capable of operating with a performance equal to or greater than the reference performance. A semiconductor chip may operate normally during a lifetime, and may not operate normally after the lifetime.

The degree of degradation means the degree to which a performance of a semiconductor chip is reduced. In the case where the degree of degradation of a semiconductor chip increases, the minimum operating level of the semiconductor chip may increase. Thus, the degree of degradation may correspond to an increment of the minimum operating level. For example, as the processor 121 operates, minimum operating levels for operating cores included in the processor 121 may increase. As the storage 123 operates, levels of voltages (e.g., a program voltage and a pass voltage) for operating the storage 123 may increase. Below, in the present disclosure, the degree of degradation may be associated with an increment of the minimum operating level. That is, that the degree of degradation of a particular semiconductor chip is high means that the minimum operating level of the semiconductor chip is significantly increased.

The degradation managing circuitry 110 may manage the degree of degradation of each component included in the electronic device 100. The degradation managing circuitry 110 may obtain information associated with the degree of degradation and a lifetime of at least one of the components (e.g., parameter values and a minimum operating level associated with the degree of degradation) from the at least one component, and may calculate the degree of degradation based on the obtained information. Further, the degradation managing circuitry 110 may perform various operations based on the degree of degradation thus calculated. For example, the degradation managing circuitry 110 may perform an operation for prolonging a lifetime of each component. In some example embodiments, the degradation managing circuitry 110 may perform an operation associated with reliability of each component.

The degradation managing circuitry 110 may include hardware circuits (e.g., an analog circuit and a logic circuit) configured to perform operations to be described in the present disclosure. In some example embodiments, all or a part of operations of the degradation managing circuitry 110 may be implemented with a program code, and an instruction set of the program code may be executed by a processor (e.g., the processor 121).

The processor 121 may control overall operations of the electronic device 100. The processor 121 may process operations for operating the electronic device 100 as a central control device. For example, the processor 121 may be one of a general-purpose processor, a workstation processor, an application processor, etc. To process operations, the processor 121 may include a single processor core (or a single core) or may include a plurality of processor cores (or a multi-core). For example, the processor 121 may include a multi-core such as a dual-core, a quad-core, a hexa-core, or the like.

The processor 121 may execute software 10 for managing the degree of degradation of each component of the electronic device 100. For example, the software 10 may be an operating system for controlling operations of the electronic device 100 or an application program that is executed by a user. The processor 121 may perform operations the same or substantially similar to the operations of the degradation managing circuitry 110 by executing the software 10.

The processor 121 may calculate the degree of degradation of each core included in the processor 121. An example method for calculating the degree of degradation of the processor 121 will be described with reference to FIGS. 4 and 5.

For example, the processor 121 may include a scheduler (not illustrated) configured to schedule tasks to be assigned to the cores of the processor 121. The scheduler may assign the tasks to the cores based on the calculated degree of degradation of each core. Example operations of the scheduler for assigning the tasks to the cores will be described with reference to FIGS. 9 to 11.

The memory 122 may store data processed or to be processed by the processor 121. For example, the memory 122 may include a volatile memory (e.g., a static random access memory (SRAM), a dynamic (DRAM), or a synchronous DRAM (SDRAM)), or a nonvolatile memory (e.g., a flash memory, a phase-change RAM (PRAM), a magneto-resistive RAM (MRAM), a resistive RAM (ReRAM), or a ferroelectric RAM (FRAM)). In some example embodiments, the memory 122 may include heterogeneous memories.

The storage 123 may store data regardless of whether a power is supplied. For example, the storage 123 may be a storage medium, which includes a nonvolatile memory, such as a hard disk drive (HDD), a solid state drive (SSD), a secure digital (SD) card, or a universal serial bus (USB) memory device.

The memory 122 may include a memory array including memory cells for storing data. The reliability of the memory cells may decrease due to degradation over time. The degree of degradation of the memory 122 and the degree of degradation of the storage 123 may be managed by operations of the degradation managing circuitry 110 or operations (operations according to the execution of the software 10) of the processor 121. Example operations of the processor 121 for managing the degree of degradation of the memory 122 and the degree of degradation of the storage 123 will be described with reference to FIG. 13.

The communication circuitry 124 may include a transmission circuit and a reception circuit. The electronic device 100 may communicate with another electronic device through the communication circuitry 124 to transmit and/or receive data. The user interface 125 may convey a command or an input/output of data between the user and the electronic device 100. The bus 126 may provide a communication path between the components of the electronic device 100. For example, the processor 121, the memory 122, the storage 123, the communication circuitry 124, and the user interface 125 may exchange data with each other through the bus 126. The bus 126 may be configured to support various communication formats used in the electronic device 100.

Below, operations of the processor 121 for managing the degree of degradation of each component of the electronic device 100 will be described, but it may be well understood that operations the same or substantially similar to the operations of the processor 121 may be performed by the degradation managing circuitry 110. Further, the present disclosure is not limited to descriptions below, and the management of the degree of degradation according to the present disclosure may be applied to any other semiconductor device in addition to the processor 121. For example, it may be well understood that the management of the degree of degradation according to the present disclosure may be adopted for the memory 122, the storage 123, or any other device identically or substantially similar to the manners to be described below.

Figure 2:
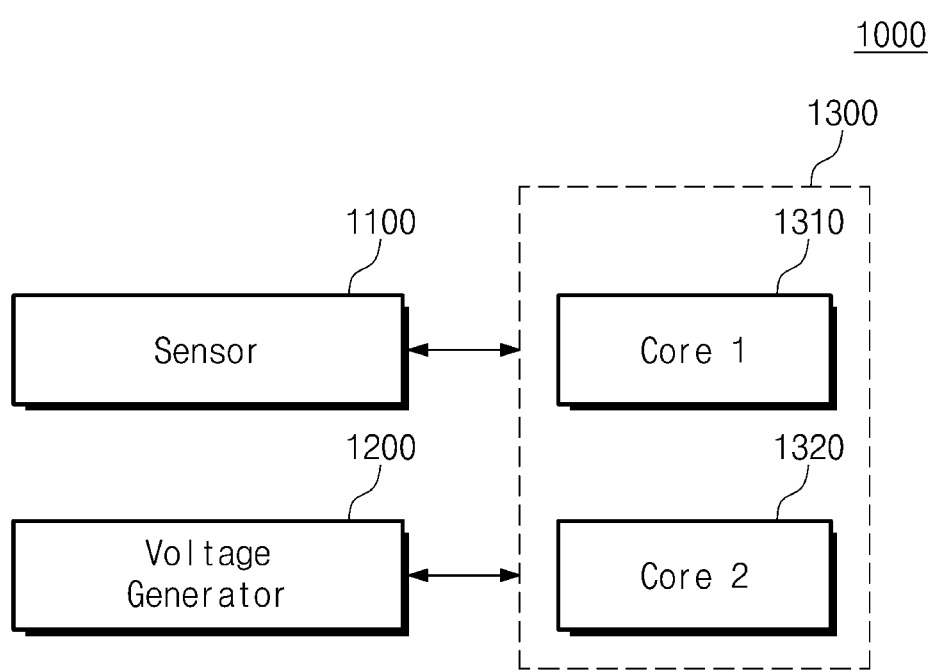
FIG. 2 is a block diagram illustrating a processor configured to manage the degree of degradation of each core, according to an example embodiment of the inventive concepts.

FIG. 2 is a block diagram illustrating a processor configured to manage the degree of degradation of each core, according to an example embodiment of the inventive concepts.

Referring to FIG. 2, a processor 1000 may include a sensor (or sensor circuit) 1100, a voltage generator 1200, and a core circuit (or core block) 1300. For example, the processor 1000 may correspond to the processor 121 of FIG. 1.

The core circuit 1300 may include a first core (or a first core portion) CORE 1 1310 and a second core (or a second core portion) CORE 2 1320. For better understanding, a description will be given as the processor 1000 includes the two cores 1310 and 1320, but it may be well understood that the processor 1000 may include one core or three or more cores. For better understanding, a description will be given as the sensor 1100 and the voltage generator 1200 are positioned within the processor 1000, but it may be well understood that at least one of the sensor 1100 and/or the voltage generator 1200 may be positioned outside the processor 1000.

The sensor 1100 may sense various factors having an influence on the degree of degradation (or a lifetime) of the cores 1310 and 1320. For example, a temperature, an operating voltage, and an operating frequency of the cores 1310 and 1320 may have an influence on the degree of degradation and lifetime of the core 1310 and the degree of degradation and lifetime of the core 1320. The sensor 1100 may sense a temperature, an operating voltage, and/or an operating frequency of the cores 1310 and 1320.

The sensor 1100 may obtain parameter values indicating the sensed factors. For example, the sensor 1100 may obtain a temperature value, a level of an operating voltage, and/or an operating frequency value of the cores 1310 and 1320. The sensor 1100 may output a signal for providing the obtained parameter values to the core circuit 1300. Example configurations and operations of the sensor 1100 will be described with reference to FIG. 3.

The voltage generator 1200 may generate voltages for operating the cores 1310 and 1320. The voltage generator 1200 may generate voltages having desired levels under control of the cores 1310 and 1320. For example, the voltage generator 1200 may generate a voltage having a level, which decreases in a stepwise form, under control of the cores 1310 and 1320.

The cores 1310 and 1320 may request the parameter values associated with the degree of degradation and lifetime of the core 1310 and the degree of degradation and lifetime of the core 1320 from the sensor 1100. The cores 1310 and 1320 may obtain the parameter values from the signal received from the sensor 1100. The cores 1310 and 1320 may be supplied with a voltage from the voltage generator 1200. The cores 1310 and 1320 may output a signal for controlling the voltage generator 1200 to the voltage generator 1200. The cores 1310 and 1320 may control a level of a voltage, which is output from the voltage generator 1200, based on the obtained parameter values.

The cores 1310 and 1320 may perform various operations for increasing the lifetimes of the cores 1310 and 1320 based on the degree of degradation of the core 1310 and the degree of degradation of the core 1320. For example, the cores 1310 and 1320 may perform operations for managing the degree of degradation of the cores 1310 and the degree of degradation of the core 1320. Example operations of the cores 1310 and 1320 for managing the degree of degradation of the core 1310 and the degree of degradation of the core 1320 will be described with reference to FIGS. 4 and 5.

Figure 3:
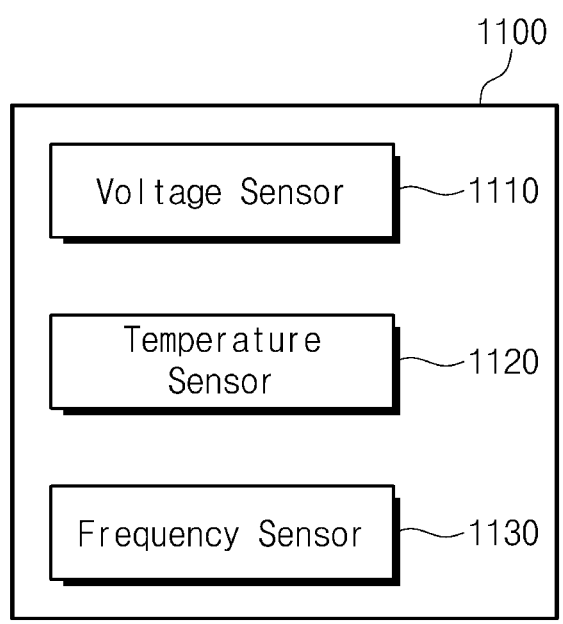
FIG. 3 is a block diagram illustrating an example configuration of a sensor of FIG. 2.

FIG. 3 is a block diagram illustrating an example configuration of a sensor of FIG. 2.

The sensor 1100 may include sensors which sense factors associated with the degree of degradation of the core 1310 and the degree of degradation of the core 1320 to obtain parameter values. In an example of FIG. 3, the sensor 1100 may include a voltage sensor 1110, a temperature sensor 1120, and a frequency sensor 1130. To sense various factors having an influence on the degree of degradation of the cores 1310 and the degree of degradation of the core 1320, the sensor 1100 may further include one or more components not illustrated in FIG. 3, or may not include at least one of the components illustrated in FIG. 3.

The voltage sensor 1110 may sense operating voltages of the cores 1310 and 1320. For example, the voltage sensor 1110 may sense a voltage supplied from the voltage generator 1200 to the cores 1310 and 1320. In some example embodiments, the voltage sensor 1110 may sense a voltage transferred within each of the cores 1310 and 1320. The voltage sensor 1110 may generate a signal indicating a level of the sensed voltage. The voltage sensor 1110 may output the generated signal to the cores 1310 and 1320.

The temperature sensor 1120 may sense a temperature of the cores 1310 and 1320. For example, the temperature sensor 1120 may sense a surface temperature of a semiconductor chip implementing the cores 1310 and 1320. In some example embodiments, the temperature sensor 1120 may sense an internal temperature of the cores 1310 and 1320. The temperature sensor 1120 may generate a signal indicating a temperature value of the sensed temperature. The temperature sensor 1120 may output the generated signal to the cores 1310 and 1320.

The frequency sensor 1130 may sense an operating frequency of each of the cores 1310 and 1320. For example, the cores 1310 and 1320 may operate based on a clock received from a clock generator outside the processor 1000. The frequency sensor 1130 may sense a frequency of a clock supplied to each of the cores 1310 and 1320. The frequency sensor 1130 may generate a signal indicating an operating frequency value of the sensed operating frequency. The frequency sensor 1130 may output the generated signal to the cores 1310 and 1320.

As such, the sensor 1100 may be used to collect information about a condition or parameter capable of having an influence on the degree of degradation and lifetime of the cores 1310 and the degree of degradation and lifetime of the core 1320. The sensor 1100 is not limited to the description given with reference to FIG. 3, and may be variously changed or modified to measure or sense values of any other conditions or parameters which may have an influence on the degree of degradation and lifetime of the core 1310 and the degree of degradation and lifetime of the core 1320.

Figure 4:
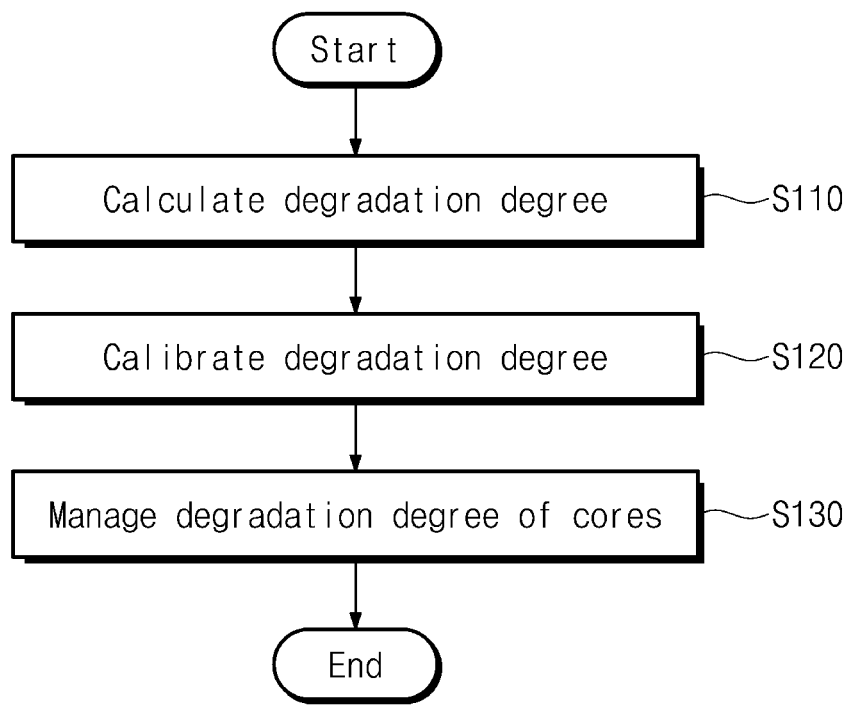
FIG. 4 is a flowchart illustrating example operations of a processor of FIG. 2.

FIG. 4 is a flowchart illustrating example operations of a processor of FIG. 2.

In operation S110, the processor 1000 may sense the degree of degradation of the core 1310 and the degree of degradation of the core 1320. The processor 1000 may predict the degree of degradation of the core 1310 and the degree of degradation of the core 1320 based on various algorithms. For the prediction, the processor 1000 may calculate the degree of degradation of the core 1310 and the degree of degradation of the core 1320 based on parameter values obtained from the sensor 1100. For example, the processor 1000 may multiply one or more weights (e.g., values set by the designer or determined empirically) and the obtained parameter values together, and calculate the degree of degradation based on values obtained by the multiplication.

For example, as described above, values of an operating voltage, a temperature, and/or an operating frequency associated with each of the cores 1310 and 1320 may be obtained by the sensor 1100. For example, an algorithm for predicting the degree of degradation may be expressed by a function having various variables associated with an operating voltage, a temperature, an operating frequency, and/or the like. To predict the degree of degradation of the core 1310 and the degree of degradation of the core 1320, the processor 1000 may calculate a function value based on values of an operating voltage, a temperature, an operating frequency, and/or any other parameter, by using the algorithm. The calculated function value may indicate the degree of degradation, which is predicted with respect to each of the cores 1310 and 1320.

In operation S120, the processor 1000 may calibrate the degree of degradation calculated in operation S110. For example, the processor 1000 may calculate the new degree of degradation of the core 1310 and the new degree of degradation of the core 1320 based on minimum operating levels of the cores 1310 and 1320. The processor 1000 may replace the degree of degradation of each of the cores 1310 and 1320 calculated in operation S110 with the degree of degradation of each of the cores 1310 and 1320 calibrated in operation S120. In some example embodiments, the processor 1000 may calculate the new degree of degradation of each of the cores 1310 and 1320 by combining the degree of degradation of each of the cores 1310 and 1320 calculated in operation S110 and the new degree of degradation of each of the cores 1310 and 1320 calculated in operation S120, based on various equations.

The degree of degradation of each of the cores 1310 and 1320 calculated in operation S110 is a prediction value (e.g., the predicted degree of degradation) based on parameter values associated with the degree of degradation and lifetime of each of the cores 1310 and 1320, whereas the degree of degradation of each of the cores 1310 and 1320 calibrated in operation S120 reflects an experimental value associated with minimum (or threshold) operating level of each of the cores 1310 and 1320. Accordingly, as the degree of degradation of each of the cores 1310 and 1320 calculated in operation S110 is calibrated through operation S120, the processor 1000 may obtain the degree of degradation of the core 1310 and the degree of degradation of the core 1320 more accurately.

In operation S130, the processor 1000 may perform operations for managing the degree of degradation of the core 1310 and the degree of degradation of the core 1320 based on the degree of degradation of each of the cores 1310 and 1320 calibrated in operation S120. For example, the processor 1000 may perform operations for balancing the degree of degradation of the core 1310 and the degree of degradation of the core 1320.

Operation S110 to operation S130 may be repeatedly performed depending on various patterns. For example, operations S110 to operation S130 may be performed at a given period. In some example embodiments, operations S110 to operation S130 may be performed at a time point when an operation of the electronic device 100 starts (e.g., when the electronic device 100 is turned on) and at a time point when the operation of the electronic device 100 ends (e.g., when the electronic device 100 is turned off). In some example embodiments, operation S110 to operation S130 may be performed with respect to a core that is in an idle state. Below, an example embodiment of each of operations S110 to operation S130 will be more fully described with reference to FIG. 5.

Figure 5:
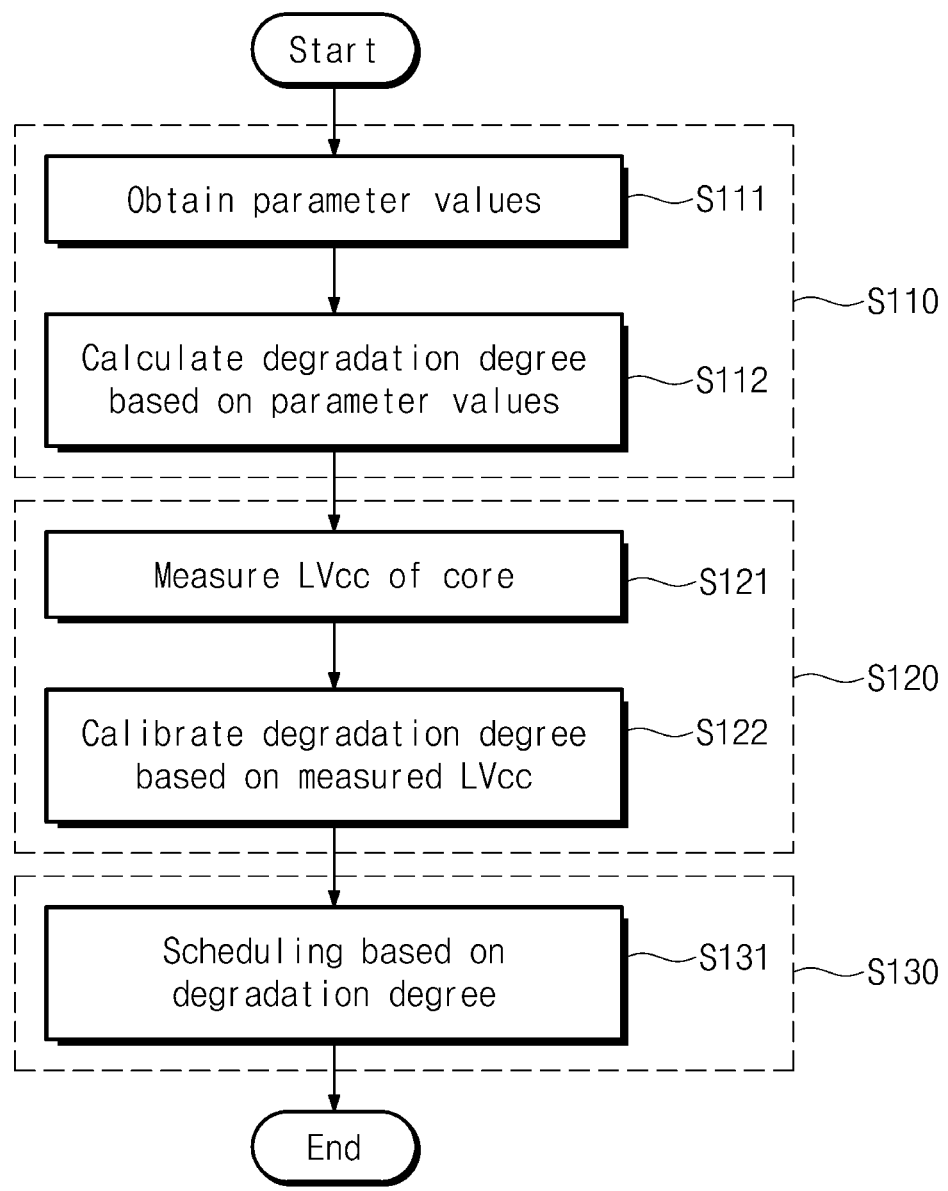
FIG. 5 is a flowchart illustrating example operations included in each operation of FIG. 4.

FIG. 5 is a flowchart illustrating example operations included in each operation of FIG. 4.

Referring to FIG. 5, operation S110 of FIG. 4 may include operation S111 and operation S112 of FIG. 5. Operation S120 of FIG. 4 may include operation S121 and operation S122 of FIG. 5. Operation S130 of FIG. 4 may include operation S131 of FIG. 5.

For example, before operation S111, the sensor 1100 may monitor the cores 1310 and 1320 in real time to obtain parameter values associated with the degree of degradation and lifetime of the core 1310 and the degree of degradation and lifetime of the core 1320. The sensor 1100 may store the parameter values obtained in real time in a memory positioned inside/outside the processor 1000.

In operation S111, the cores 1310 and 1320 may request the parameter values of each of the cores 1310 and 1320 from the sensor 1100. The sensor 1100 may provide the parameter values in response to the request of the cores 1310 and 1320. For example, the sensor 1100 may provide the cores 1310 and 1320 with the parameter values which are obtained in real time and are stored in the memory. The cores 1310 and 1320 may obtain the parameter values provided from the sensor 1100. For example, the cores 1310 and 1320 may obtain a temperature value, a level of an operating voltage, and/or an operating frequency value of each of the cores 1310 and 1320.

In operation S112, the cores 1310 and 1320 may calculate the degree of degradation of the core 1310 and the degree of degradation of the core 1320 based on the parameter values obtained in operation S111. Each of the cores 1310 and 1320 may calculate the degree of degradation depending on various algorithms. For example, in the case where an internal temperature of the cores 1310 and 1320 is high (e.g., in the case where the obtained temperature value is greater than a reference temperature value), the calculated degree of degradation of each of the cores 1310 and 1320 may be high (e.g., the calculated degree of degradation may be greater than a threshold degree of degradation). In the case where the cores 1310 and 1320 operate based on an operating voltage of a high level (e.g., in the case where the obtained level of the operating voltage is high), the calculated degree of degradation of each of the cores 1310 and 1320 may be high (e.g., the calculated degree of degradation may be greater than a threshold degree of degradation). In the case where the cores 1310 and 1320 operate based on a high operating frequency (e.g., in the case where the obtained operating frequency value is greater than a reference frequency value), the calculated degree of degradation of each of the cores 1310 and 1320 may be high (e.g., the calculated degree of degradation may be greater than a threshold degree of degradation).

In operation S121, the sensor 1100 may measure a minimum operating level of the core 1310 and a minimum operating level of the core 1320. The sensor 1100 may measure the minimum operating level of the core 1310 and the minimum operating level of the core 1320 based on various methods. For example, the sensor 1100 may measure the minimum operating level in a state where the sensor 1100 controls the voltage generator 1200 such that a level of a voltage supplied to a core (e.g., the first core 1310 or the second core 1320), which is in an idle state, gradually (or stepwise) decreases. An example method for measuring a minimum operating level will be described with reference to FIG. 6.

In operation S122, each of the cores 1310 and 1320 may calibrate the degree of degradation calculated in operation S112 based on the minimum operating level measured in operation S121. For example, each of the cores 1310 and 1320 may calculate the degree of degradation for calibration based on the minimum operating level measured in operation S121. Each of the cores 1310 and 1320 may calculate the new degree of degradation based on the degree of degradation calculated in operation S112 and the degree of degradation for calibration. For example, each of the cores 1310 and 1320 may calculate the new degree of degradation by combining values which are obtained based on (e.g., by multiplying) one or more weights (e.g., values set by the designer or determined empirically), and one or more the degree of degradation values calculated in operation S112, and one or more the degree of degradation values for calibration together. In some example embodiments, each of the cores 1310 and 1320 may replace the degree of degradation calculated in operation S112 with the degree of degradation for calibration.

In operation S131, a scheduler may schedule tasks that are to be assigned to the cores 1310 and 1320 based on the degree of degradation calibrated in operation S122. For example, the scheduler may first assign tasks to a core, of which the degree of degradation is relatively lower, from among the cores 1310 and 1320. Some examples of scheduling associated with tasks of the cores 1310 and 1320 will be described with reference to FIGS. 9 to 11.

For better understanding, a description is given as operation S121 is performed after operation S111 and operation S112, but operation S121 may be performed at any time point before operation S122 is performed.

Figure 6:
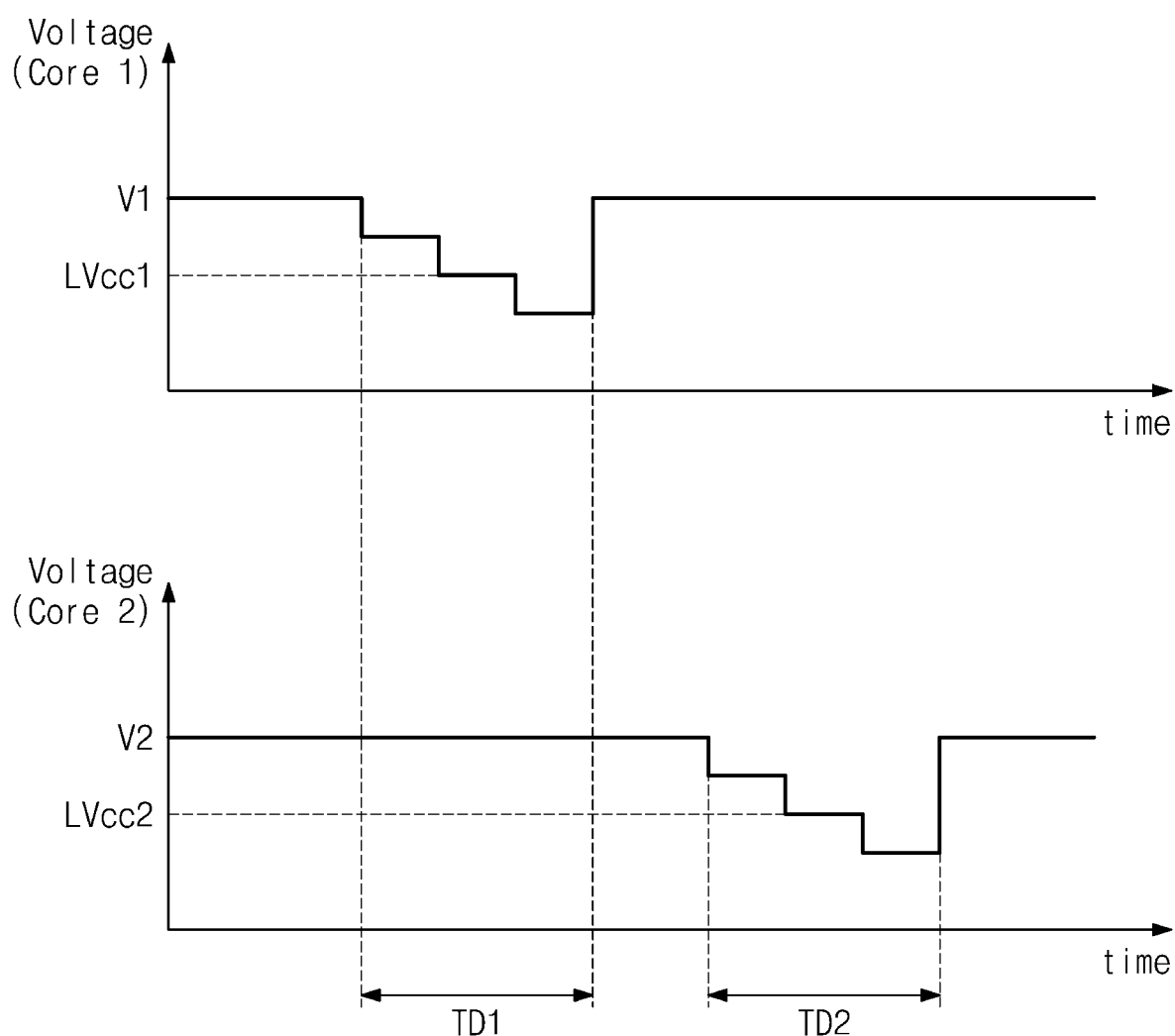
FIG. 6 is a diagram illustrating graphs associated with an example method for measuring minimum operating levels of cores of FIG. 2.

FIG. 6 is a diagram illustrating graphs associated with an example method for measuring minimum operating levels of cores of FIG. 2. In an upper graph of FIG. 6, an x-axis represents a time, and a y-axis represent an operating voltage of the first core 1310 (e.g., a voltage supplied from the voltage generator 1200 of FIG. 2 to the first core 1310). In a lower graph of FIG. 6, an x-axis represents a time, and a y-axis represent an operating voltage of the second core 1320 (e.g., a voltage supplied from the voltage generator 1200 of FIG. 2 to the second core 1320).

An example method for measuring a minimum operating level of a core being in an idle state among the cores 1310 and 1320 will be described with reference to FIG. 6, but the inventive concepts are not limited thereto. For example, as described with reference to FIG. 4, minimum operating levels of the cores 1310 and 1320 may be measured at various time points including time points when a power of the processor 1000 is turned on and/or off. For example, the minimum operating levels may be measured by various methods including a method in which the minimum operating levels of the cores 1310 and 1320 are directly measured by a separate sensor included in the processor 1000.

In the example of FIG. 6, the first core 1310 may be in an idle state in a time duration TD1, and the second core 1320 may be in an idle state in a time duration TD2. Before minimum operating levels are measured, a level of an operating voltage of the first core 1310 may be "V1", and a level of an operating voltage of the second core 1320 may be "V2". For example, "V1" and "V2" may be determined in consideration of the reference performance of the cores 1310 and 1320, respectively. For example, "V1" and "V2" may be values which are sufficiently greater than expected minimum operating levels (e.g., minimum operating levels predicted based on the degree of degradation calculated in operation S111 and operation S112 of FIG. 5). In some example embodiments, "V1" and "V2" may be determined in consideration of the degree of degradation predicted with respect to each of the cores 1310 and 1320 in operation S110 of FIG. 4.

In the first time duration TD1, the minimum operating level of the first core 1310 may be measured. For example, under control of the sensor 1100, the voltage generator 1200 may decrease a level of a voltage provided to the first core 1310. For example, the voltage generator 1200 may decrease the level of the voltage in a stepwise form, but the inventive concepts are not limited thereto.

For example, a level of an operating voltage provided to the first core 1310 may stepwise decrease from "V1". Whenever the level of the operating voltage decreases, whether the first core 1310 operates normally may be tested with regard to each level of the operating voltage. For example, an operation of the first core 1310 may be tested through a scenario-based benchmarking test. For example, during the test, the operations of the first core 1310 are variously monitored and tested as to whether an intended (or desired) performance of the first core 1310 is obtained or whether an error or a disorder is occurred.

When the level of the operating voltage provided to the first core 1310 is not less than the minimum operating level, the first core 1310 may pass the test. In contrast, when the level of the operating voltage provided to the first core 1310 is less than the minimum operating level, the first core 1310 may not pass the test. Accordingly, the test of the first core 1310 may be performed to measure the minimum operating level. For example, the minimum operating level of the operating voltage of the first core 1310 may be measured to be "LVcc1".

In this case, the first core 1310 may operate normally based on a voltage having a level of "LVcc1" or more. In the case where the first core 1310 operates normally, the first core 1310 may transmit a signal indicating that an operation is performed normally to the sensor 1100. The sensor 1100 may measure the level of the operating voltage of the first core 1310 in response to the received signal.

The first core 1310 may not operate normally if a level of the voltage is less than "LVcc1". Accordingly, since the signal indicating that the operation is performed normally may not be input from the first core 1310 to the sensor 1100, and the sensor 1100 may determine the "LVcc1", which corresponds to a level of an operating voltage most recently measured, as the minimum operating level of the first core 1310. The first core 1310 may obtain the "LVcc1" being the minimum operating level through the sensor 1100.

For example, testing the first core 1310 for the purpose of measuring the minimum operating level may have an influence on operations of the first core 1310 (e.g., may make the performance of the first core 1310 low). Accordingly, the test may be performed at a time (e.g., an idle time or a power on/off time) when an influence on the operations of the first core 1310 is minimized.

In the second time duration TD2, the minimum operating level of the second core 1320 may be measured. For example, under control of the sensor 1100, the voltage generator 1200 may stepwise decrease a level of a voltage provided to the second core 1320. For example, the voltage generator 1200 may decrease the level of the voltage in a stepwise form, but the inventive concepts are not limited thereto. As the level of the voltage varies, the second core 1320 may be tested identically or substantially similarly to the test of the first core 1310.

The second core 1320 may operate normally based on a voltage having a level of "LVcc2" or more. In the case where the second core 1320 operates normally, the second core 1320 may transmit a signal indicating that an operation is performed normally to the sensor 1100. The sensor 1100 may measure a level of the operating voltage of the second core 1320 in response to the received signal.

The second core 1320 may not operate normally if a level of the voltage is less than "LVcc2". Accordingly, the signal indicating that an operation is performed normally may not be input from the second core 1320 to the sensor 1100, and the sensor 1100 may determine the "LVcc2", which corresponds to a level of an operating voltage most recently measured, as the minimum operating level of the second core 1320. The second core 1320 may obtain the "LVcc2" being the minimum operating level through the sensor 1100.

Figure 7:
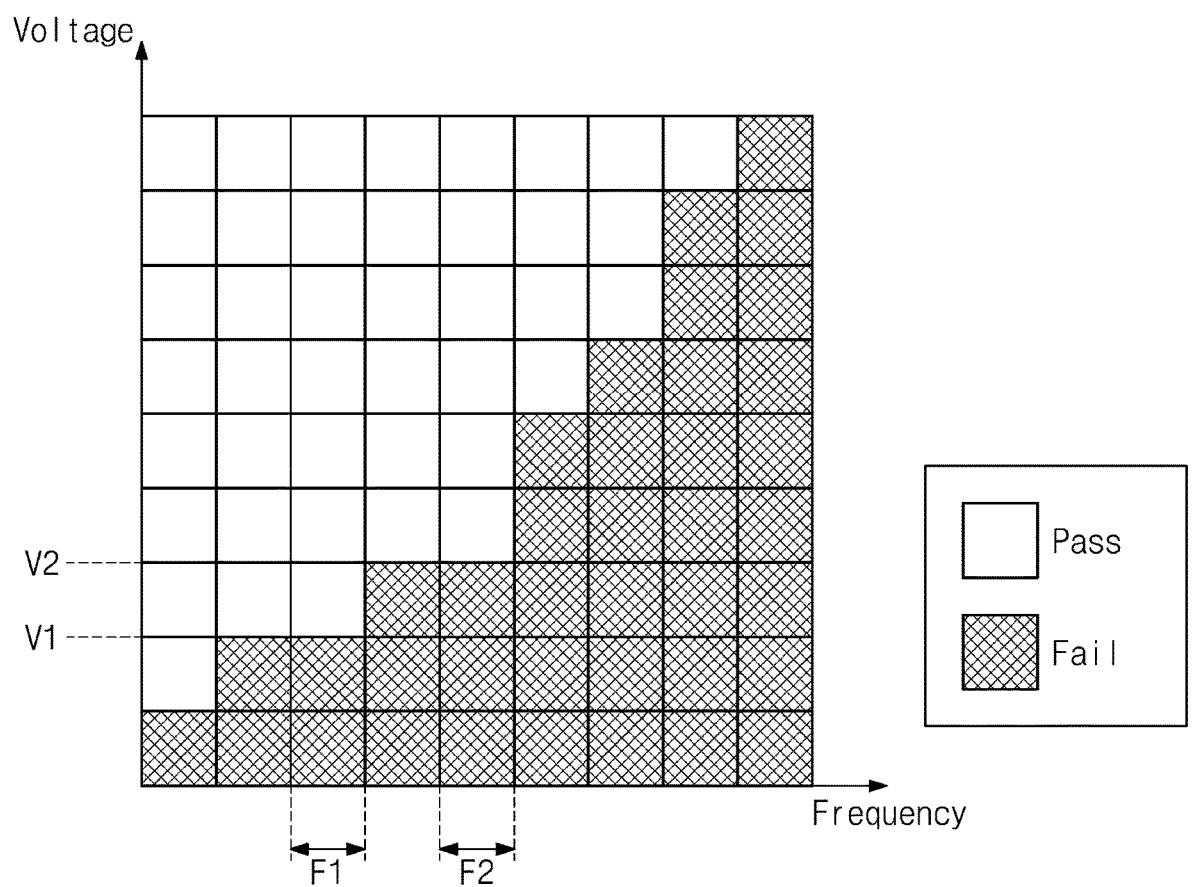
FIGS. 7 and 8 are graphs illustrating minimum operating levels measured by operations of FIG. 6.
Figure 8:
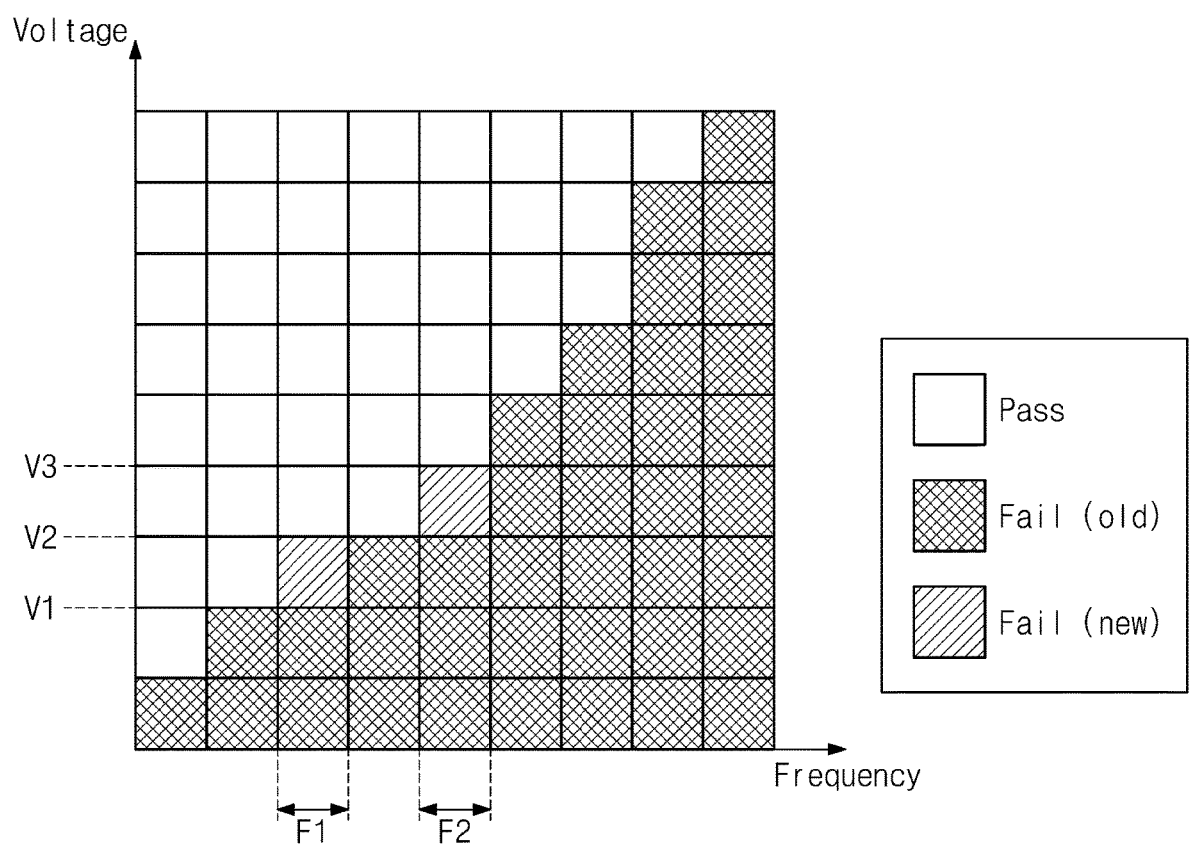

FIGS. 7 and 8 are graphs illustrating minimum operating levels measured by operations of FIG. 6. The minimum operating level of the first core 1310 will be described with reference to FIGS. 7 and 8. The way to measure the minimum operating level of the second core 1320 is the same as or substantially similar to the way to measure the minimum operating level of the first core 1310. Thus, a description associated with the way to measure the minimum operating level of the second core 1320 will be omitted.

In graphs of FIGS. 7 and 8, an x-axis represents an operating frequency value of the first core 1310, and a y-axis represents an operating voltage of the first core 1310 provided from the voltage generator 1200 of FIG. 2. In the graphs of FIGS. 7 and 8, shaded boxes indicate that the first core 1310 does not operate normally ("Fail"), and white boxes indicate that the first core 1310 operates normally ("Pass").

The minimum operating level of the first core 1310 may be measured for each operating frequency of the first core 1310. For example, the operating frequency of the first core 1310 may be a frequency of a clock supplied from a clock generator to the first core 1310. For example, in the case where the first core 1310 operates based on a high operating frequency, the first core 1310 may process more tasks within a particular time duration. For the first core 1310 to process more tasks, the first core 1310 may consumes more power. Accordingly, as the operating frequency of the first core 1310 becomes higher, the minimum operating level of the first core 1310 may become higher.

For example, the minimum operating level of the first core 1310 may be "V1" in a "F1" band, and the minimum operating level of the first core 1310 may be "V2" in a "F2" band. The "F2" band may be higher than the "F1" band, and "V2" may be greater than "V1".

After the minimum operating level of the first core 1310 is measured as illustrated in FIG. 7, the first core 1310 may process various tasks. As the first core 1310 operates to process tasks, the degree of degradation of the first core 1310 may increase. The minimum operating level of the first core 1310 having the increased degree of degradation may be measured again. The graph of FIG. 8 may be a graph illustrating the minimum operating level of the first core 1310 measured again after obtaining the graph of FIG. 7.

Referring to FIG. 8, in the "F1" band, the first core 1310 may not operate normally based on a voltage of "V1". The first core 1310 may operate normally based on a voltage of "V2" or more. Accordingly, the minimum operating level of the first core 1310 may be "V2". Referring to FIGS. 7 and 8, the minimum operating level of the first core 1310 may increase from "V1" to "V2" in the "F1" band. Further, referring to FIG. 8, the minimum operating level of the first core 1310 may increase from "V2" to "V3" in the "F2" band.

Afterwards, operation S122 and operation S131 of FIG. 5 may be performed based on the measured minimum operating levels "V2" and "V3". The actually measured minimum operating levels may be used to compensate or calibrate the degree of degradation predicted in operation S110 of FIG. 4. Because "V2" and "V3" are actually measured minimum operating levels, in the case where "V2" and "V3" are applied to the degree of degradation of the core 1310 and the degree of degradation of the core 1320 (e.g., in the case where the degree of degradation of the core 1310 and the degree of degradation of the core 1320 calculated in operation S112 are calibrated based on "V2" and "V3"), each of the cores 1310 and 1320 may obtain the accurate degree of degradation.

Figure 9:
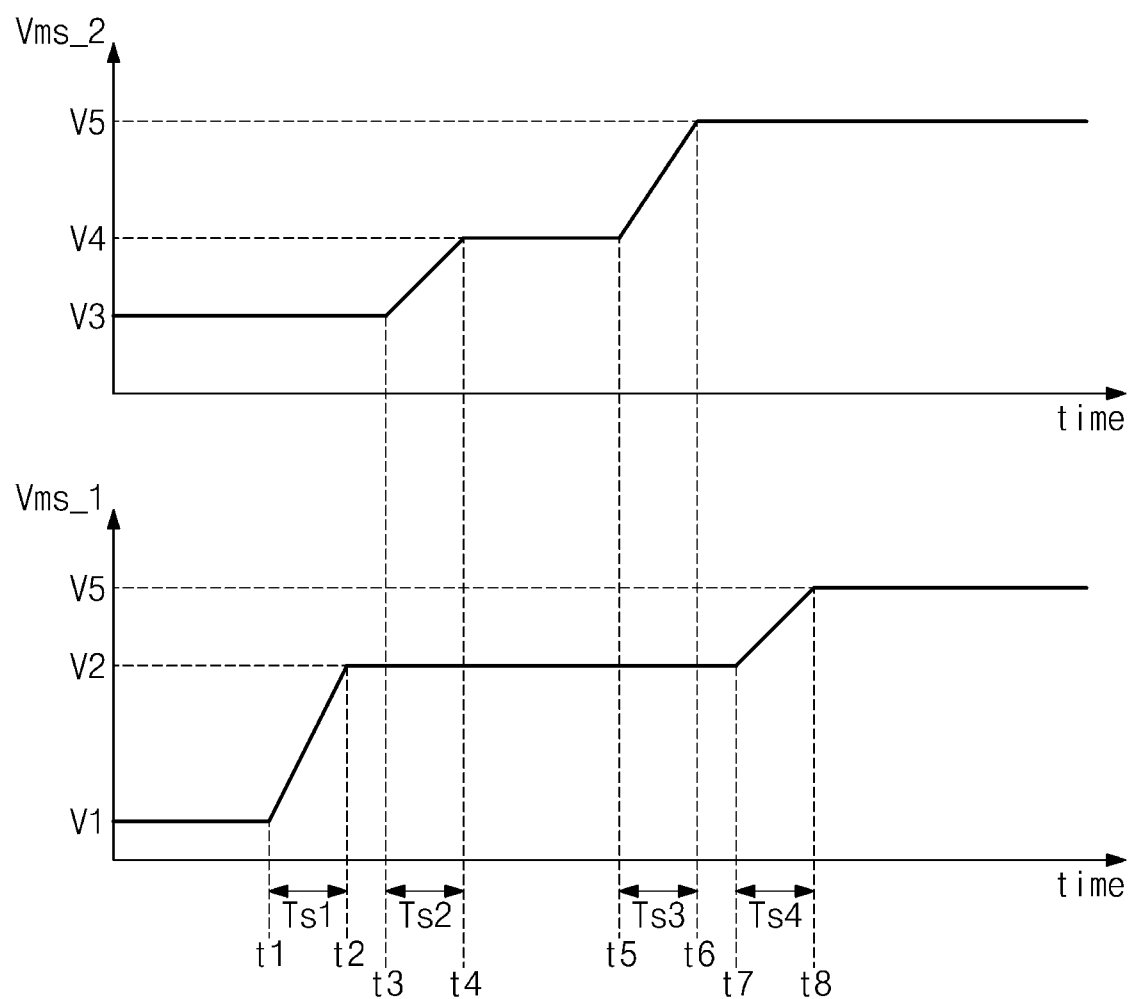
FIG. 9 is a diagram illustrating graphs for describing the degree of degradation of each core of FIG. 2.
Figure 10:
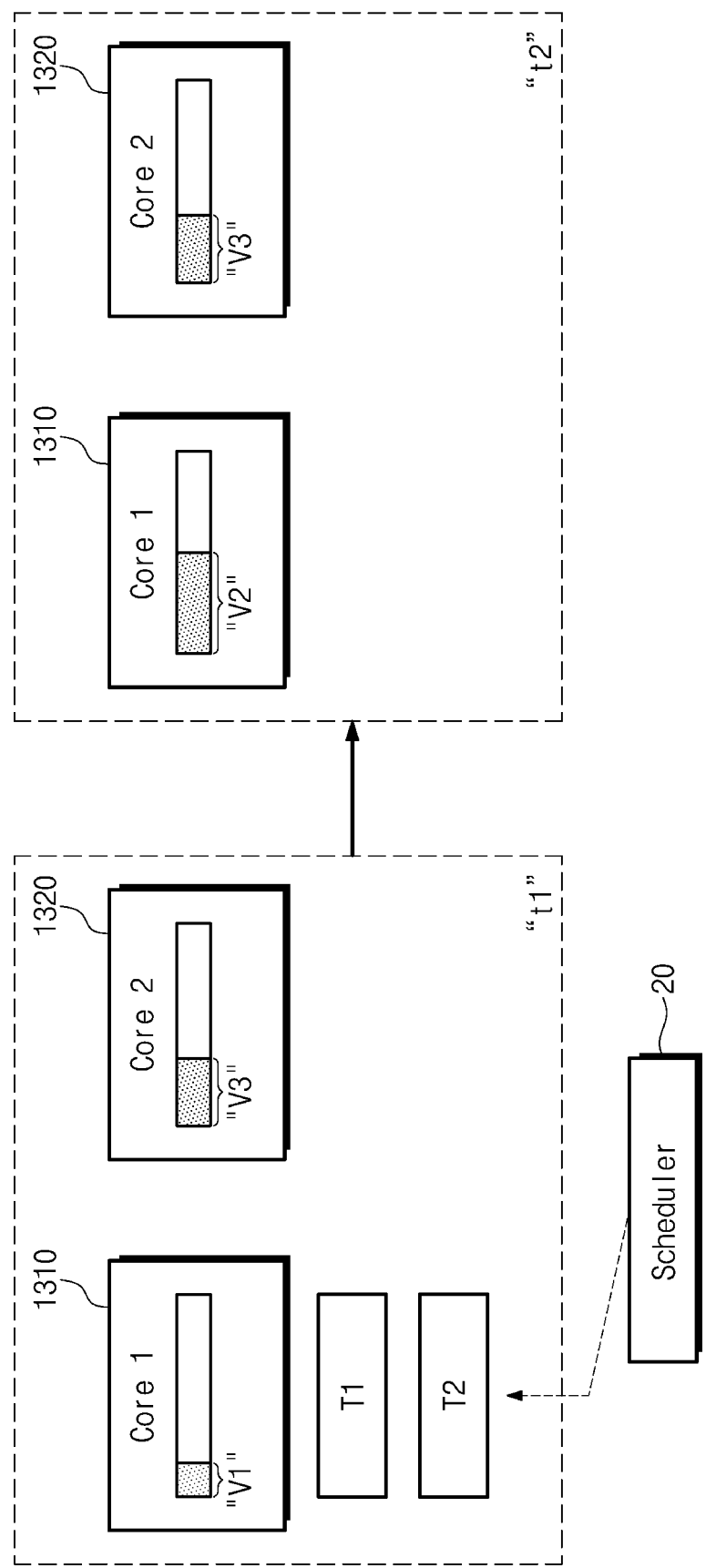
FIGS. 10 and 11 are conceptual diagrams illustrating example operations for assigning tasks to cores of FIG. 2.
Figure 11:
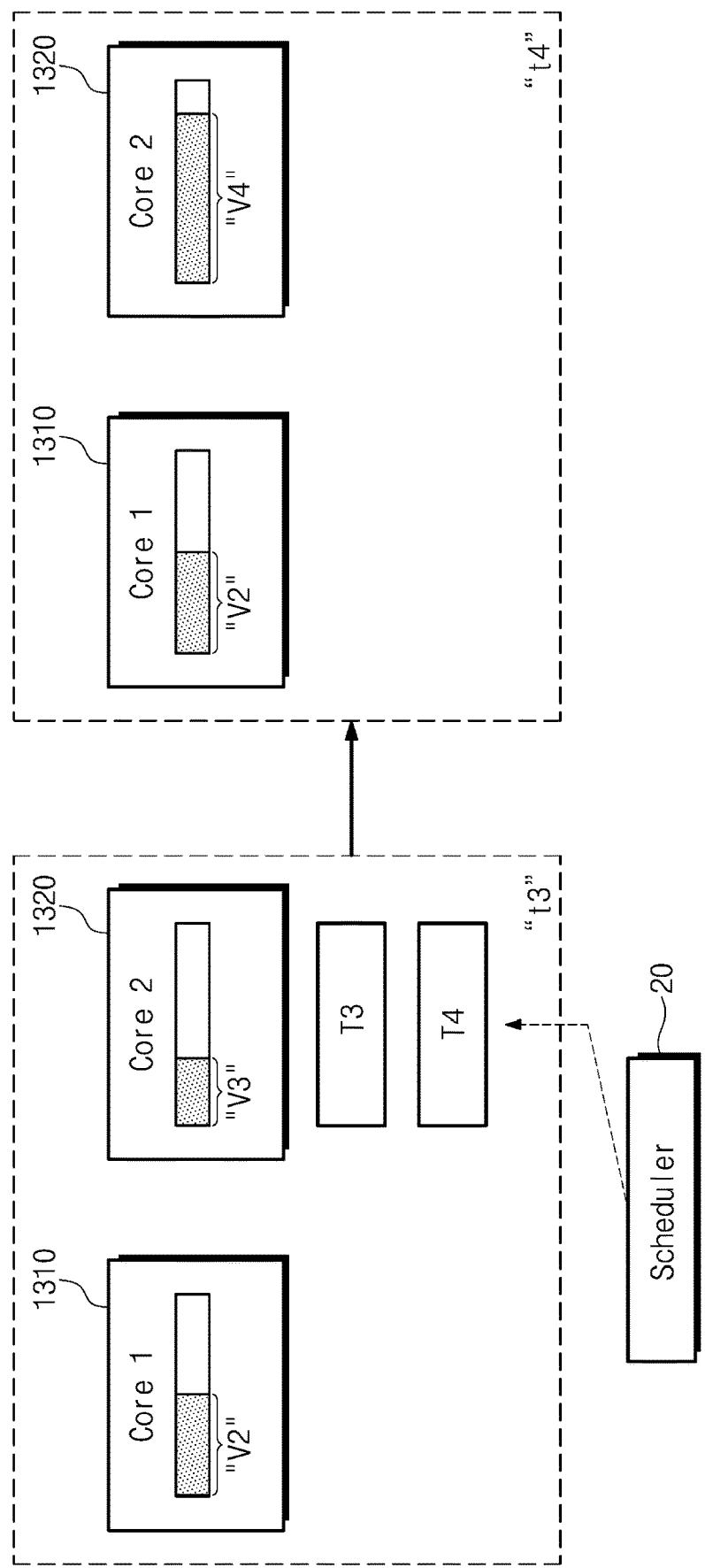

FIG. 9 is a diagram illustrating graphs for describing the degree of degradation of each core of FIG. 2. FIGS. 10 and 11 are conceptual diagrams illustrating example operations for assigning tasks to cores of FIG. 2. As described with reference to FIG. 5, the processor 1000 may include a scheduler 20 for scheduling tasks assigned to the cores 1310 and 1320. Example operations of the scheduler 20 for scheduling tasks assigned to the cores 1310 and 1320 based on the degree of degradation of the core 1310 and the degree of degradation of the core 1320 will be described with reference to FIGS. 9 to 11.

In graphs of FIG. 9, an x-axis represents a time, and a y-axis represents the degree of degradation "Vms_1" of the first core 1310 and the degree of degradation "Vms_2" of the second core 1320, respectively. The cores 1310 and 1320 may obtain the degree of degradation "Vms_1" and the degree of degradation "Vms_2" through operation S111, operation S112, operation S121, and operation S122 of FIG. 5, respectively. In the examples of FIGS. 10 and 11, each bar graph illustrated in the cores 1310 and 1320 indicates the degree of degradation of each of the cores 1310 and 1320. In an area of the bar graph, a shaded portion may correspond to a magnitude of the degree of degradation.

Referring to FIG. 9, before a time point "t1", the degree of degradation of the first core 1310 may be "V1", and the degree of degradation of the second core 1320 may be "V3," which is greater than "V1". Because the degree of degradation of the first core 1310 is less than the degree of degradation of the second core 1320, the scheduler 20 may assign tasks to the first core 1310.

For example, referring to FIG. 10, at the time point "t1", the scheduler 20 may assign a task "T1" and a task "T2" to the first core 1310 having the degree of degradation of "V1". In a time duration Ts1 between the time point "t1" and a time point "t2", the task "T1" and the task "T2" may be performed by the first core 1310. As the first core 1310 processes the assigned tasks, the degree of degradation of the first core 1310 may increase. Accordingly, at the time point "t2", the degree of degradation of the first core 1310 may increase from "V1" to "V2".

Referring to FIG. 9, from the time point "t2" to a time point "t3", the degree of degradation of the first core 1310 may be "V2", and the degree of degradation of the second core 1320 may be "V3," which is less than "V2". Because the degree of degradation of the second core 1320 is less than the degree of degradation of the first core 1310, the scheduler 20 may assign tasks to the second core 1320.

Referring to FIG. 11, at the time point "t3", the scheduler 20 may assign a task "T3" and a task "T4" to the second core 1320 having the degree of degradation of "V3". In a time duration Ts2 between the time point "t3" and a time point "t4", the task "T3" and the task "T4" may be performed by the second core 1320. As the second core 1320 processes the assigned tasks, the degree of degradation of the second core 1320 may increase. Accordingly, at the time point "t4", the degree of degradation of the second core 1320 may increase from "V3" to "V4".

Referring to FIG. 9, from the time point "t4" to a time point "t5", the degree of degradation of the first core 1310 may be "V2", and the degree of degradation of the second core 1320 may be "V4," which is less than "V2". Because the degree of degradation of the first core 1310 is greater than the degree of degradation of the second core 1320, the scheduler 20 may assign tasks to the second core 1320. For example, the scheduler 20 may assign tasks to the second core 1320 as illustrated in FIG. 11. As the second core 1320 processes the assigned tasks during a time duration Ts3, the degree of degradation of the second core 1320 may increase. Accordingly, at a time point "t6", the degree of degradation of the second core 1320 may increase from "V4" to "V5".

Referring to FIG. 9, from the time point "t6" to a time point "t7", the degree of degradation of the first core 1310 may be "V2", and the degree of degradation of the second core 1320 may be "V5," which is greater than "V2". Because the degree of degradation of the first core 1310 is less than the degree of degradation of the second core 1320, the scheduler 20 may assign tasks to the first core 1310. For example, the scheduler 20 may assign tasks to the first core 1310 as illustrated in FIG. 10. As the first core 1310 processes the assigned tasks during a time duration Ts4, the degree of degradation of the first core 1310 may increase. Accordingly, at the time point "t8", the degree of degradation of the first core 1310 may increase from "V2" to "V5".

As the scheduler 20 assigns tasks to a core, of which the degree of degradation is relatively low, from among the cores 1310 and 1320 from the time point "t1" to an eighth time point "t8", the degree of degradation of the core 1310 and the degree of degradation of the core 1320 may be balanced to, for example, "V5". That is, the degree of degradation of the core 1310 and the degree of degradation of the core 1320 may become the same or substantially similar to each other through the scheduling considering the degree of degradation. An example scheduling based on the degree of degradation is described with reference to FIGS. 9 to 11, but the inventive concepts are not limited thereto. For example, it may be well understood that the inventive concepts may perform various operations for balancing the degree of degradation of the core 1310 and the degree of degradation of the core 1320.

Figure 12:
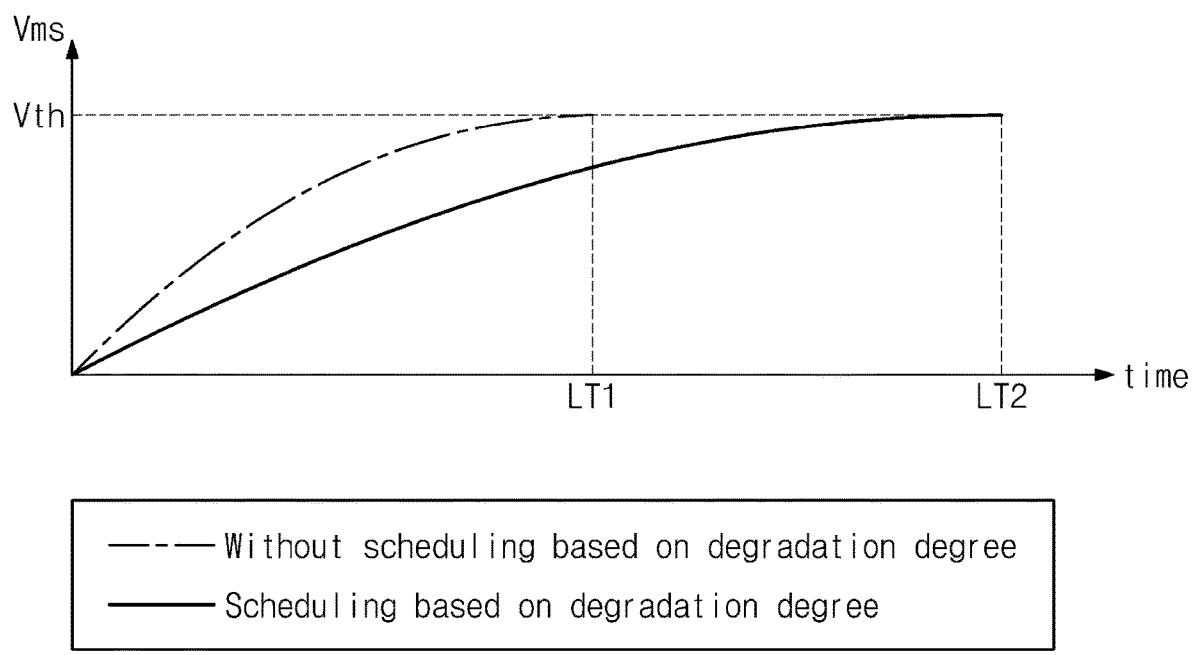
FIG. 12 is a diagram illustrating a lifetime of a processor configured to perform operations of FIGS. 9 to 11 and a lifetime of a processor not configured to perform operations of FIGS. 9 to 11.

FIG. 12 is a diagram illustrating a lifetime of a processor configured to perform operations of FIGS. 9 to 11 and a lifetime of a processor not configured to perform operations of FIGS. 9 to 11.

In an example of FIG. 12, an x-axis represents a time, and a y-axis represents the degree of degradation "Vms" of a core included in the processor 1000. FIG. 12 shows the degree of degradation curves associated with the greatest degree of degradation of the core 1310 included in the processor 1000 and the greatest degree of degradation of the core 1320 included in the processor 1000. It is assumed that a core having the degree of degradation greater than a threshold value "Vth" does not operate normally. For example, an operating speed of a core having the degree of degradation greater than the threshold value "Vth" may be lower than an operating speed desired by the user. Accordingly, a time length from a time point "t0" when the processor 1000 starts an operation for the first time to a time point when the degree of degradation of the processor 1000 reaches the threshold value "Vth" may be referred to as a lifetime of the processor 1000.

In the case where the degree of degradation of one of the cores 1310 and 1320 included in the processor 1000 is greater than "Vth", the processor 1000 may not operate normally. In the case where scheduling is performed without considering the degree of degradation of the core 1310 and the degree of degradation of the core 1320, tasks could be continuously assigned to a core, of which the degree of degradation is relatively higher, from among the cores 1310 and 1320. Accordingly, the degree of degradation of one of the cores 1310 and 1320 may reach the threshold value "Vth" at a relatively early time point "LT1", and the overall lifetime of the processor 1000 may become shorter (refer to an alternated long and short dash line).

In the case where scheduling is performed in consideration of the degree of degradation of the core 1310 and the degree of degradation of the core 1320, tasks may be assigned to a core, of which the degree of degradation is relatively lower, from among the cores 1310 and 1320, as described with reference to FIGS. 9 to 11. Accordingly, the degree of degradation of the cores 1310 and the degree of degradation of the core 1320 may be balanced, and the degree of deterioration of one of the cores 1310 and 1320 may reach the threshold value "Vth" at a relatively late time point "LT2" (refer to a solid line). That is, the lifetime of the processor 1000 may become longer by performing scheduling in consideration of the degree of degradation of the core 1310 and the degree of degradation of the core 1320.

Figure 13:
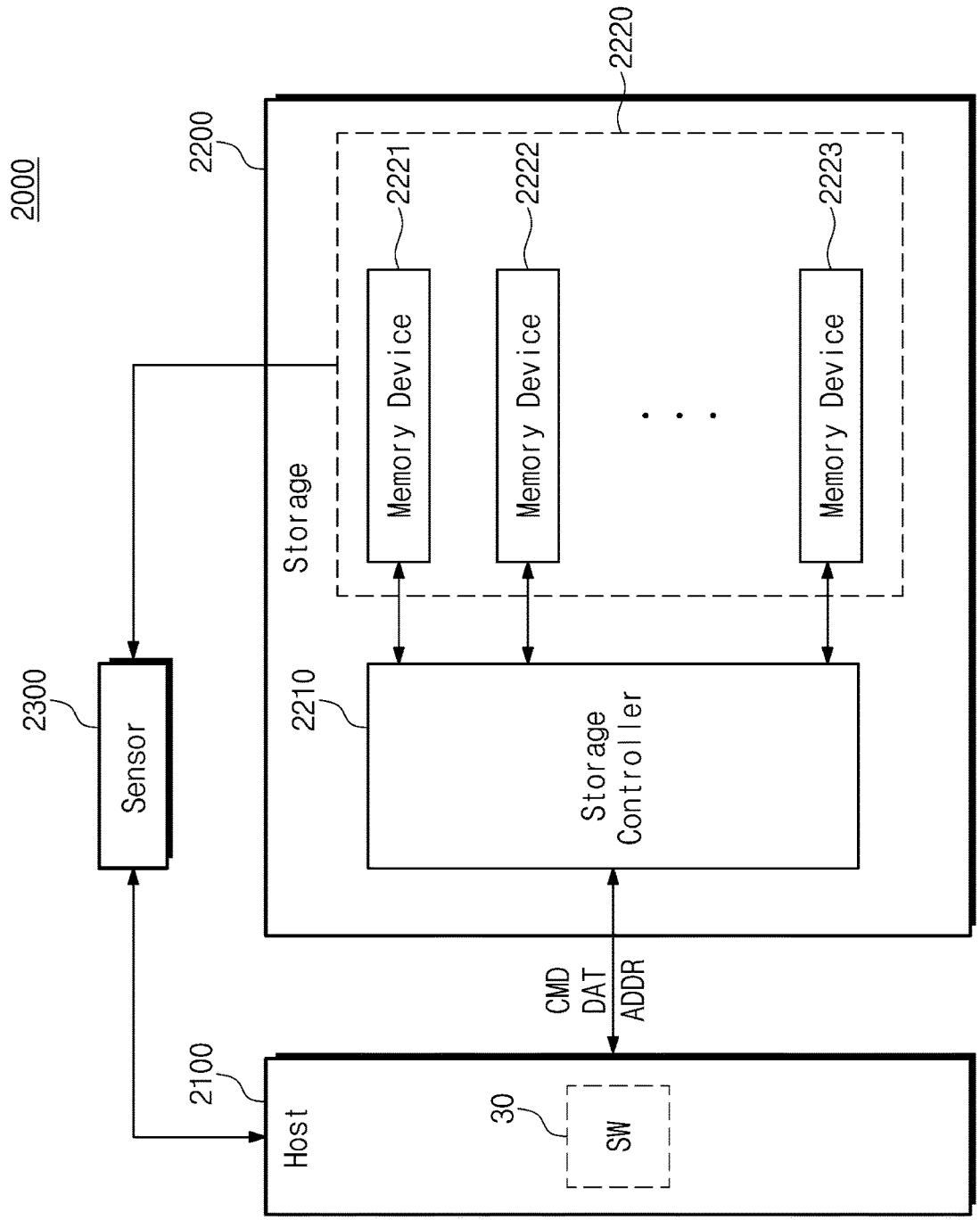
FIG. 13 is a block diagram illustrating an electronic device configured to manage the degree of degradation of storage, according to an example embodiment of the inventive concepts.

FIG. 13 is a block diagram illustrating an electronic device configured to manage the degree of degradation of storage, according to an example embodiment of the inventive concepts.

An electronic device 2000 may include a host 2100, a storage 2200 and a sensor (or a sensor circuit) 2300. As described with reference to FIG. 1, the processor 121 may access the storage 123 for the purpose of managing the degree of degradation of the storage 123. In an example of FIG. 13, the host 2100 may access the storage 2200. Thus, the host 2100 of FIG. 13 may correspond to the processor 121 of FIG. 1. The host 2100 may execute software 30 corresponding to the software 10 of FIG. 1. The storage 2200 may be configured to store data or output the stored data. For example, the storage 2200 of FIG. 13 may correspond to the storage 123 or the memory 122 of FIG. 1.

The host 2100 may exchange data DAT with the storage 2200. The storage 2200 may provide a storage service for the host 2100 in response to a command CMD received from the host 2100. The host 2100 may exchange an address ADDR associated with memory areas in memory devices 2221 to 2223 with the storage 2200.

For example, the host 2100 may provide the command CMD including a write request and the data DAT including write data to the storage 2200. The storage 2200 may store requested write data to the memory devices 2221 to 2223 in response to the write request. For example, the host 2100 may provide the command CMD including a read request to the storage 2200. The storage 2200 may output requested read data from the memory devices 2221 to 2223 to the host 2100 in response to the read request.

Each of the memory devices 2221 to 2223 may store or output data requested by the host 2100. Each of the memory devices 2221 to 2223 may include a memory area for storing data. Write data may be stored to a memory area directed by the address ADDR, and read data may be output from a memory area directed by the address ADDR.

Due to iterative operations in which data are stored to the memory devices 2221 to 2223 and data stored in the memory devices 2221 to 2223 are erased, the degree of degradation of each of the memory devices 2221 to 2223 may increase. For example, a memory area of each of the memory devices 2221 and 2223 may include a plurality of memory cells. The memory cells may include a semiconductor element for storing data. As a voltage is repeatedly applied to a semiconductor element, the degree of degradation of the semiconductor element may increase. For example, insulating layers of the memory cells may be broken down or may deteriorate.

The host 2100 may execute the software 30 for managing the degree of degradation of each of the memory devices 2221 to 2223. The host 2100 may perform operations the same as or substantially similar to the operations described with reference to FIG. 4 for the purpose of managing the degree of degradation of each of the memory devices 2221 to 2223.

For example, in operation S110, the host 2100 may obtain parameter values indicating a factor(s) having an influence on the degree of degradation of each of the memory devices 2221 to 2223 from the memory devices 2221 to 2223. The host 2100 may calculate the degree of degradation of each of the memory devices 2221 to 2223 based on the obtained parameter values.

In operation S120, the host 2100 may measure levels of voltages supplied to the memory devices 2221 to 2223. In some example embodiments, the host 2100 may measure levels of voltages (e.g., a program voltage or a pass voltage) that are generated within the memory devices 2221 to 2223. The host 2100 may calibrate the degrees of degradation calculated in operation S110 based on the measured levels of the voltages.

In operation S130, the host 2100 may perform various operations based on the degree of degradation of each of the memory devices 2221 to 2223. Each of the memory devices 2221 to 2223 may perform any other operation based on the degree of degradation, instead of an operation which has been performed. For example, the memory devices 2221 to 2223 may change levels of generated program and pass voltages.

In some example embodiments, the host 2100 may balance the memory devices 2221 to 2223 in the degree of degradation, and thus, the lifetimes of the memory devices 2221 to 2223 may increase. For example, in the case where the degree of degradation of each of the memory devices 2221 to 2223 increases, the reliability of the memory devices 2221 to 2223 may decrease. In some example embodiments, in the case where the degree of degradation of each of the memory devices 2221 to 2223 increases to a threshold value or more, the host 2100 may provide a notification associated with the reliability of the memory devices 2221 to 2223 to the user of the electronic device 2000.

A storage controller 2210 may control overall operations of the storage 2200. The storage controller 2210 may control the memory devices 2221 to 2223 to allow the memory devices 2221 to 2223 to store or output data.

The sensor 2300 may correspond to the sensor 1100 of FIG. 2. The sensor 2300 may sense a temperature, an operating voltage, and/or an operating frequency of a target circuit.

The host 2100 may include a control circuit (not shown). For example, the control circuit may be configured to obtain a degree of degradation of each of the memory devices 2221 to 2223 (e.g. a semiconductor chip) based on a parameter value and an operating level, the parameter value being associated with a lifetime of each of the memory devices 2221 to 2223, the operating level being associated with a reference performance of each of the memory devices 2221 to 2223, control one of the memory devices 2221 to 2223 to perform a first operation, and start a second operation of the one of the memory devices 2221 to 2223, which has been controlled to perform the first operation, based on the obtained degree of degradation.

Figure 14:
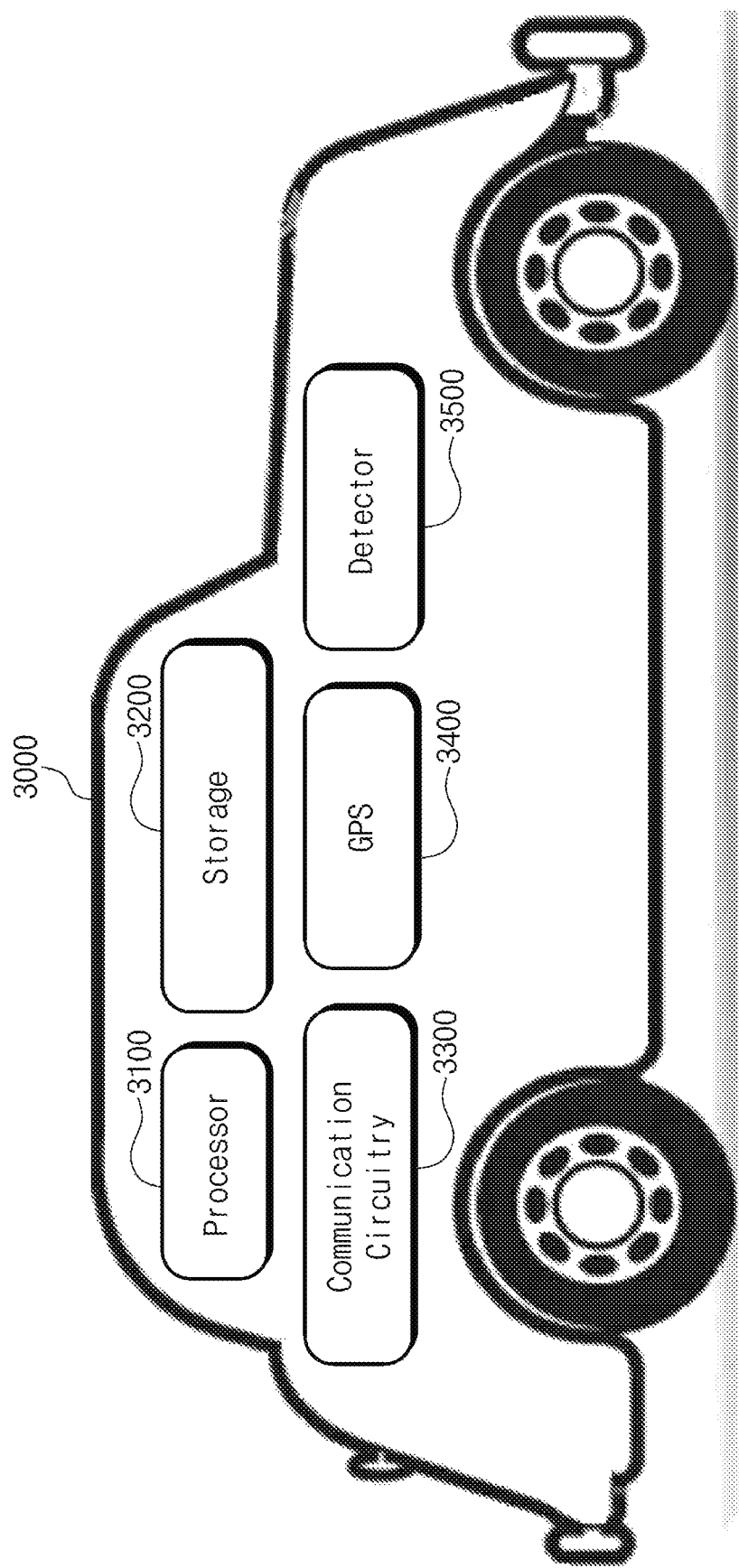
FIG. 14 is a conceptual diagram illustrating a vehicle including an electronic device of FIG. 1.

FIG. 14 is a conceptual diagram illustrating a vehicle including an electronic device of FIG. 1.

A vehicle 3000 may include a processor 3100, a storage 3200, a communication circuitry 3300, a GPS 3400, and a detector 3500. The vehicle 3000 may not include one or more of the components illustrated in FIG. 14. The vehicle 3000 may include one or more components not illustrated in FIG. 14.

The processor 3100 may correspond to the processor 1000 of FIG. 1, the processor 1000 of FIG. 2, or the host 2100 of FIG. 13. The processor 3100 may control overall operations of the components included in the vehicle 3000.

For example, the processor 3100 may communicate with an external electronic device, any other vehicle, and a system through the communication circuitry 3300. The processor 3100 may obtain information about a position of the vehicle 3000 based on a signal received from the GPS 3400. The processor 3100 may obtain information about an ambient environment of the vehicle 3000 based on a signal received from the detector 3500.

For example, the processor 3100 may operate as an electronic control unit (ECU) of the vehicle 3000. To control a movement of the vehicle 3000, the processor 3100 may operate as an anti-lock braking system (ABS), a traction control system (TCS), a vehicle dynamic control (VDC), and/or a tire pressure monitoring system (TPMS). The processor 3100 may control an operation of the vehicle 3000 based on data provided from an air flow sensor (AFS), a throttle position sensor (TPS), an air temperature sensor (ATS), a barometric pressure sensor (BPS), a crank angle sensor (CAS), and/or an idle speed controller (ISC).

The processor 3100 may perform operations associated with the degree of degradation of each component of the vehicle 3000. For example, the processor 3100 may perform operations for balancing cores included in the processor 3100 in the degree of degradation. In some example embodiments, the processor 3100 may access the storage 3200 to perform operations associated with the degree of degradation of the storage 3200. The processor 3100 may be configured identically or substantially similar to those described with reference to FIGS. 1 to 13, and thus, additional description will be omitted to avoid redundancy.

The storage 3200 may include the storage 2200 of FIG. 13. The storage 3200 may store data processed or to be processed by the processor 3100. For example, the storage 3200 may store data associated with a movement, stability, and a position of the vehicle 3000 and an ambient environment of the vehicle 3000. The degree of degradation of the storage 3200 may be calculated by the processor 3100. To this end, the minimum operating level of the storage 3200 may be measured by the processor 3100. An example configuration and example operations of the storage 3200 are described with reference to FIG. 13, and thus, additional description will be omitted to avoid redundancy.

The communication circuitry 3300 may communicate with an external electronic device of the vehicle 3000, any other vehicle, and a system based on various protocols. The communication circuitry 3300 may include transmission circuitry (not shown) and reception circuitry (not shown). The GPS 3400 may receive a signal associated with a position of the vehicle 3000 from a satellite. The GPS 3400 may generate a signal indicating position information of the vehicle 3000 based on the received signal. The detector 3500 may include devices for obtaining information about an ambient environment of the vehicle 3000. For example, the detector 3500 may include a RADAR (RAdio Detection And Ranging), a LIDAR (LIght Detection And Ranging), an infrared sensor, and/or an imaging device.

The processors and various circuitries included in the example embodiments described herein may include processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to an example embodiment of the inventive concepts, the degree of degradation of a semiconductor chip may be accurately calculated, and the lifetime of the semiconductor chip may increase.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. An electronic device comprising:
   a processor configured to,
      obtain a first degree of degradation of a first core based on a first parameter value and a first operating level, the first parameter value being associated with a first lifetime of the first core, the first operating level being associated with a first operation of the first core,
      obtain a second degree of degradation of a second core based on a second parameter value and a second operating level, the second parameter value being associated with a second lifetime of the second core, the second operating level being associated with a second operation of the second core, and schedule a task with respect to the first core and the second core based on the first degree of degradation and the second degree of degradation; and a sensor configured to provide the first parameter value and the first operating level to the first core, and the second parameter value and the second operating level to the second core, wherein the first operating level is a first minimum level of a first operating voltage for operating the first core with a first reference performance, and the second operating level is a second minimum level of a second operating voltage for operating the second core with a second reference performance, and wherein the processor is further configured to calculate a predicted degree of degradation of the first core based on the first parameter value, wherein the first minimum level of the first operating voltage is a minimum voltage level at which the first core in an idle state normally operates as the first operating voltage applied to the first core decreases, and wherein the second minimum level of the second operating voltage is a minimum voltage level at which the second core in an idle state normally operates as the second operating voltage applied to the second core decreases.

2. The electronic device of claim 1, wherein the first parameter value is associated with at least one of the first operating voltage, a temperature of the first core, or an operating frequency of the first core.

3. The electronic device of claim 1, wherein the first reference performance is associated with the first lifetime of the first core and a first operating speed of the first core, and the second reference performance is associated with the second lifetime of the second core and a second operating speed of the second core.

4. The electronic device of claim 1, wherein the processor is further configured to:
assign the task to the first core when the first degree of degradation is less than the second degree of degradation; and
assign the task to the second core when the second degree of degradation is less than the first degree of degradation.

5. The electronic device of claim 1, wherein
the sensor is further configured to measure the first operating level, and
the processor is further configured to obtain the first degree of degradation by calibrating the predicted degree of degradation based on the first operating level.

6. The electronic device of claim 1, further comprising:
a voltage generator configured to generate the first operating voltage and the second operating voltage.

7. The electronic device of claim 6, wherein the sensor is further configured to measure the first operating level by controlling the voltage generator such that a level of the first operating voltage is adjusted.

8. The electronic device of claim 1, wherein the sensor is further configured to measure the first operating level when the first core is in an idle state.

9. The electronic device of claim 1, wherein the first degree of degradation is associated with an increment of the first operating level due to the operation of the first core.

* * * * *